United States Patent
Mori

[11] Patent Number: 5,408,632
[45] Date of Patent: Apr. 18, 1995

[54] SEMICONDUCTOR MEMORY HAVING A BIT POSITION DECODER AND DATE RE-ORDERING CIRCUITRY FOR ARRANGING BITS IN A WORD OF DATA

[75] Inventor: Toshiki Mori, Ibaraki, Japan

[73] Assignee: Matsushita Electric Industrial Co., Ltd., Osaka, Japan

[21] Appl. No.: 96,858

[22] Filed: Jul. 26, 1993

Related U.S. Application Data

[63] Continuation of Ser. No. 716,508, Jun. 17, 1991, abandoned.

[30] Foreign Application Priority Data

Jun. 15, 1990 [JP] Japan .................. 2-157958

[51] Int. Cl.6 .................. G06F 7/00; G06F 12/04; G06F 13/00; G11C 7/00
[52] U.S. Cl. .................. 395/425; 365/230.06; 365/238.5; 364/DIG. 2; 395/400; 345/200
[58] Field of Search .................. 395/425, 400; 365/238.5, 221, 189.12, 230.09, 230.06, 239, 240; 345/185, 197, 200; 364/166

[56] References Cited

U.S. PATENT DOCUMENTS

| | | | |
|---|---|---|---|
| 4,473,894 | 9/1984 | Yagihashi | 365/189.12 |
| 4,561,072 | 12/1985 | Arakawa et al. | 365/238.5 |
| 4,597,063 | 6/1986 | Takemae | 365/230.06 |
| 4,644,503 | 2/1987 | Bantz et al. | 365/238.5 |
| 4,729,119 | 3/1988 | Dennison et al. | 365/230.09 |
| 4,769,790 | 9/1988 | Yamashita | 365/189.12 |
| 4,773,048 | 9/1988 | Kai | 365/230.03 |
| 4,799,149 | 1/1989 | Wolf | 395/425 |
| 4,809,232 | 2/1989 | Baumbaugh et al. | 365/221 |
| 4,811,297 | 3/1989 | Ogawa | 365/189.02 |
| 4,833,657 | 5/1989 | Tanaka | 365/230.04 |
| 4,845,664 | 7/1989 | Aichelmann, Jr. et al. | 395/425 |
| 4,890,255 | 12/1989 | Lehmann et al. | 395/725 |
| 4,962,486 | 10/1990 | Masuda et al. | 365/230.03 |
| 4,965,770 | 10/1990 | Yanagisawa | 365/238.5 |
| 5,008,852 | 4/1991 | Mizoguchi | 395/425 |
| 5,107,415 | 4/1992 | Sato et al. | 395/800 |
| 5,121,354 | 6/1992 | Mandalia | 365/189.02 |

*Primary Examiner*—Glenn Gossage
*Attorney, Agent, or Firm*—Wenderoth, Lind & Ponack

[57] ABSTRACT

A semiconductor memory device for simultaneously accessing data in groups of four bits includes a memory cell block for storing a plurality of 4-bit words. The memory cell block has a plurality of memory cell outputs which are connected to column gate transistors. A gate control circuit is provided for controlling the column gate transistors to access four consecutive bits of data in the memory cells. The accessed four consecutive bits, including a portion of one word and a portion of a subsequent word, are aligned such that the portion of the subsequent word is followed by the portion of one word. A data re-ordering circuit is provided for re-ordering the accessed consecutive bits to align them such that the portion of one word is followed by the portion of the subsequent word.

5 Claims, 8 Drawing Sheets

Fig. 1b

| Ao1 | Aoo | So | S1 | S2 |
|---|---|---|---|---|
| 0 | 0 | 0 | 0 | 0 |
| 0 | — | — | 0 | 0 |
| — | 0 | — | — | 0 |
| — | — | — | — | — |

Fig. 2

| COLUMN ADDRESS | 0 | | | | 1 | | | | 2 | | | |
|---|---|---|---|---|---|---|---|---|---|---|---|---|
| Ao1, Aoo ADDRESS | (0,0) | (0,1) | (1,0) | (1,1) | (0,0) | (0,1) | (1,0) | (1,1) | (0,0) | (0,1) | (1,0) | (1,1) |
| DATA BUS D0 | B0 | B4 | B4 | B4 | B4 | B5 | B8 | B8 | B8 | B12 | B12 | B12 |
| D1 | B1 | B1 | B5 | B5 | B5 | B5 | B9 | B9 | B9 | B9 | B13 | B13 |
| D2 | B2 | B2 | B2 | B6 | B6 | B6 | B6 | B10 | B10 | B10 | B10 | B14 |
| D3 | B3 | B3 | B3 | B3 | B7 | B7 | B7 | B7 | B11 | B11 | B11 | B11 |

| Aoi | Aoo | 38a | 38b | 38c | 38d |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

SEMICONDUCTOR MEMORY HAVING A BIT POSITION DECODER AND DATE RE-ORDERING CIRCUITRY FOR ARRANGING BITS IN A WORD OF DATA

This application is a continuation of now abandoned application, Ser. No. 07/716,508, filed on Jun. 17, 1991, now abandoned.

BACKGROUND OF THE INVENTION

1. Field of the Invention

The present invention relates to a semiconductor memory device, and more particularly to a column selection circuit which is effective when used with a video memory which stores image data.

2. Description of the Prior Art

Semiconductor memory devices have plural bit data input/output (I/O) terminals, and read and write data in block units (hereinafter referred to as "words") equal to the bit width of the data in the data I/O terminals. The wider the bit width of the data word, the greater the number of bits which can be read or written in a single access operation, thereby enabling high speed data access.

The construction of a conventional semiconductor memory device is shown in FIG. 7. The data storage section, which is comprised of memory cells for storing the data, is arrayed in block units as shown by memory cell blocks 2a and 2b. A single memory plane 1-1 is formed by the two memory cell blocks 2a and 2b, which share a column decoder 4. The complete data storage unit is formed by providing n memory planes (1-1 to 1-n).

Each memory plane 1-1 to 1-n comprises memory cell blocks 2a and 2b, row decoders 5a and 5b, column decoder 4, and column selection gates 3a and 3b. The data word in each memory cell block is selectively connected to the data buses 6-1, 6-2, 6-3, 6-4, . . . 6-(2n-1), 6-(2n) according to the address signal provided by an address signal input means (not shown). The block selection gates 7-1, 7-2, 7-3, 7-4, . . . 7-(2n-1), 7-(2n) select data from a word on each memory cell block data bus 6-1, 6-2, 6-3, 6-4, . . . 6-(2n-1), 6-(2n), and outputs the data to the data I/O bus 9. The block selection signals 8-1, 8-2, 8-3, 8-4, . . . 8-(2n-1), 8(2n) are generated so that one of the signals is selected according to the address signal supplied by the address signal input means.

The write circuit 10 outputs the data supplied from the data I/O terminal 12 in the write operation to the data I/O bus 9. The read circuit 11 outputs the data or to the data I/O bus 9 to the data I/O terminal 12 in the read operation.

In this device, the bit width of the each of buses 6-1, 6-2, 6-3, 6-4, . . . 6-(2n-1), 6-(2n) and the data I/O bus 9 is the bit width of the data word, and is equal to the bit width of the data I/O terminal 12.

FIG. 8 is a schematic diagram of a column selector wherein the data bus 6 has a bit width equal to 4 bits. The column selection gate 3 has a plurality of switching transistors T0 . . . Tm which are connected to bit line outputs B0 . . . Bm in the memory cell block 2, respectively. The first four switching transistors T0 . . . T3, which are in group 3-1, are connected to data bus lines D0 . . . D3, respectively. Similarly, the second four switching transistors T4 . . . T7, which are in group 3-2, are connected to data bus lines D0 . . . D3. Likewise, four switching transistors in a group are each connected to data bus lines D0 . . . D3. Furthermore, the gate electrodes of the first four switching transistors T0 . . . T3 in group 3-1 are commonly connected to output C0 of column decoder 4. Similarly, the gate electrodes of the second four switching transistors T4 . . . T7 in group 3-2 are commonly connected to output C1 of column decoder 4. Likewise, the gate electrodes of four switching transistors in a group are commonly connected to one output of the column decoder 4.

The column decoder 4 drives one of the outputs C0 . . . Cn to designate one group according to the address signal supplied by the address signal input means. The four switching transistors in the designated group 3-1, 3-2, 3-3, or 3-n are driven by the output from the column decoder 4, so that selected 4-bit data are produced from the memory cell block 2 through corresponding four outputs of bit line outputs B0 . . . Bm, and are further applied to four lines in the data bus 6. Thus, each memory cell block is accessed in units equal to the bit width of the data bus 6, and the bit position of the data bus 6 to which each bit line output B0 . . . Bm corresponds is fixed. In other words, according to the prior art semiconductor memory device shown in FIG. 8, it is possible to access the previously grouped four consecutive outputs B0 . . . B3 simultaneously, but it is not possible to access simultaneously four consecutive outputs in other combinations, such as B1 . . . B4, B2 . . . B5 or B3 . . . B6.

FIG. 9 is a circuit diagram of the block selection gate 7. The block selection gates 7-1 to 7-(2n) are driven by the block selection signals 8-1 to 8-(2n), respectively. Each block selection gate, e.g. gate 7-1, comprises four switching transistors inserted in four lines D0 . . . D3, respectively. The four lines D0 . . . D3 are in turn connected to four lines in the data I/O bus 9. By one of the block selection signals 8-1 to 8(2n) being driven according to the address signal provided by the address signal input means, one of the data buses 6-1 . . . 6-(2n) is selected and connected to the data I/O bus. The lines in data I/O bus 6 are connected respectively to the lines in data I/O bus 9 at the block selection gate 7.

As thus described with respect to a conventional semiconductor memory device above, the bit width of a single word, which is the bit width of the data I/O terminals, is increased to enable high speed data access, and the memory area is accessed by specifying the address position in word units. When a semiconductor memory of this construction is used as a computer data storage device no problems are encountered because the memory is accessed in units with each unit having a predetermined bit width, but the following problems occur when this memory device is used as a video memory for image data storing.

According to the semiconductor memory device described above, it is not possible to simultaneously access the four consecutive bits of data which are in a combination other than the previously grouped combination. This disadvantage is further explained below.

FIG. 10 illustrates data access in the display image area of a semiconductor memory device used for video memory and storing image data to be displayed as a graphic image on screen. The memory is accessed in 4 bit word units at each address, and the data at the set positions corresponds to each bit D0 . . . D3 at the data I/O terminal. It is desirable to use a large data I/O terminal bit width and to increase the data width which can be accessed in a single video memory access operation in order to achieve high speed image data processing. However, image data accessed for processing is accessed in pixel (bit) units, and the address position specification is in bit units regardless of the bit width of the data word.

Because specifying an address position is only possible in word units equal to the bit width of the data I/O terminal in a conventional semiconductor memory device, the use of such memory devices as a video memory necessitates the use of an external barrel shifter to shift the bit position, or a mask processing circuit to mask the bits not read or written, thus complicating the video memory structure. In addition, the shift operation of the barrel shifter and the masking operation require the memory to be accessed multiple times at the bit width of the data I/O terminal, resulting in a slower processing time.

SUMMARY OF THE INVENTION

The present invention has been developed to substantially overcome the disadvantages described above, and is intended to provide an improved semiconductor memory device which specifies an address position in one-bit units to access a plurality of bits without using a barrel shifter or mask processing circuit.

The present invention relates to a semiconductor memory device for accessing data in one word. According to the present invention, the semiconductor memory device comprises: a column selection gate array wherein each gate is connected to a memory cell array bit line output and is independently controlled; a column selection gate controller which controls the column selection gate array by specifying a bit position with respect to a selected column; and a data re-ordering means which reorders or rearranges the bit order according to the bit position specification and outputs the word data, selected by the column selection gate, to the data I/O bus.

By means of the aforementioned construction, the present invention can specify any memory cell as a starting bit of a data word using a semiconductor memory device of a simple construction wherein data is accessed by words of a multiple bit width.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which:

FIG. 1b is a table showing the correlation between the address input signal and the control signal code used in the circuit of FIG. 1a;

FIG. 2 is a table describing the bit order on the data bus shown in FIG. 1a;

FIG. 4a is a circuit diagram of a bit position control signal circuit;

FIG. 4b is a table showing the correlation between the address input signal and the control signal code used in the circuit of FIG. 4a;

DETAILED DESCRIPTION OF THE PREFERRED EMBODIMENT

Figure 1A:
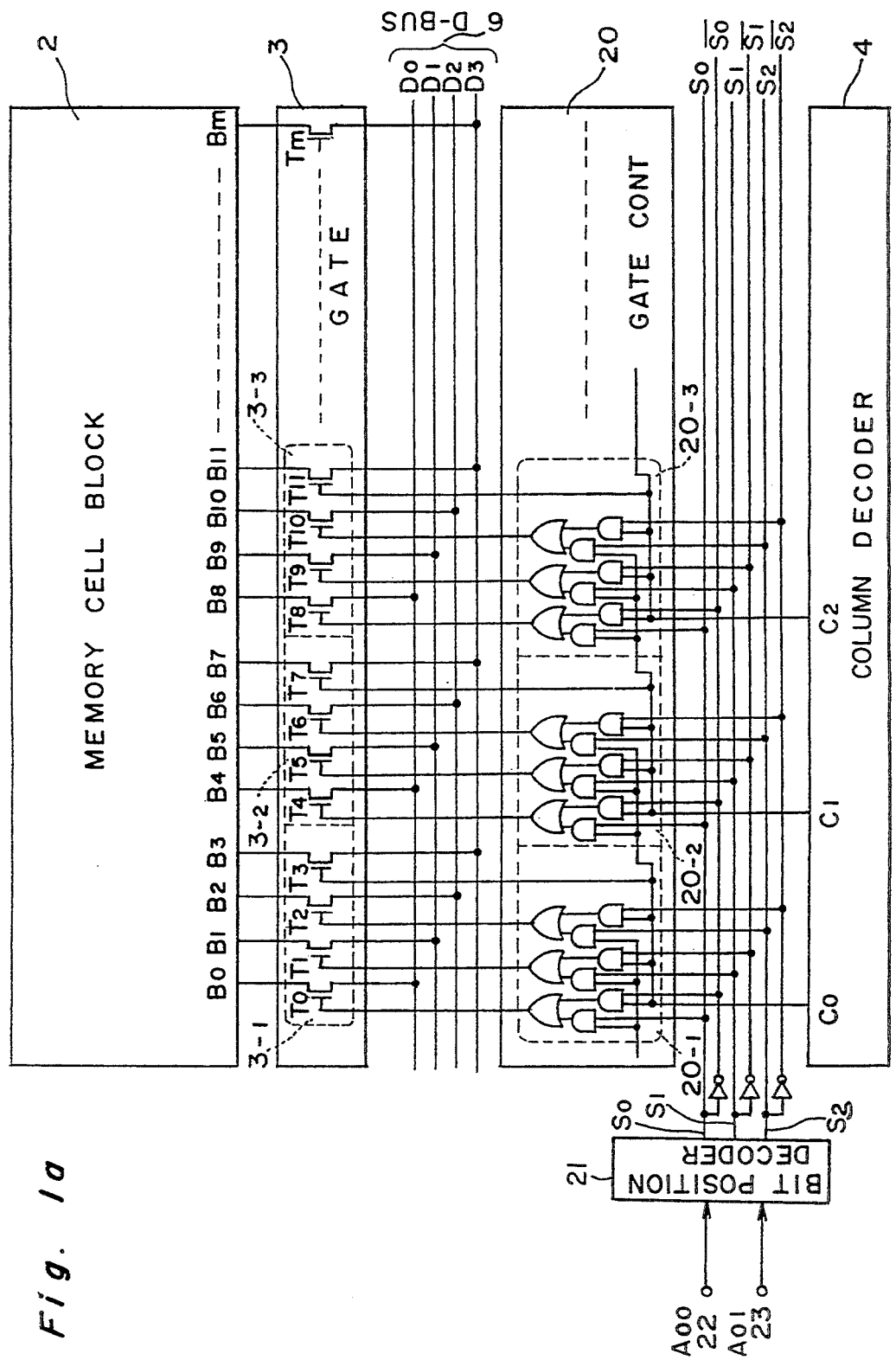
FIG. 1a is a circuit diagram showing a column selector in a semiconductor memory device according to a preferred embodiment of the present intention.
Figure 7:
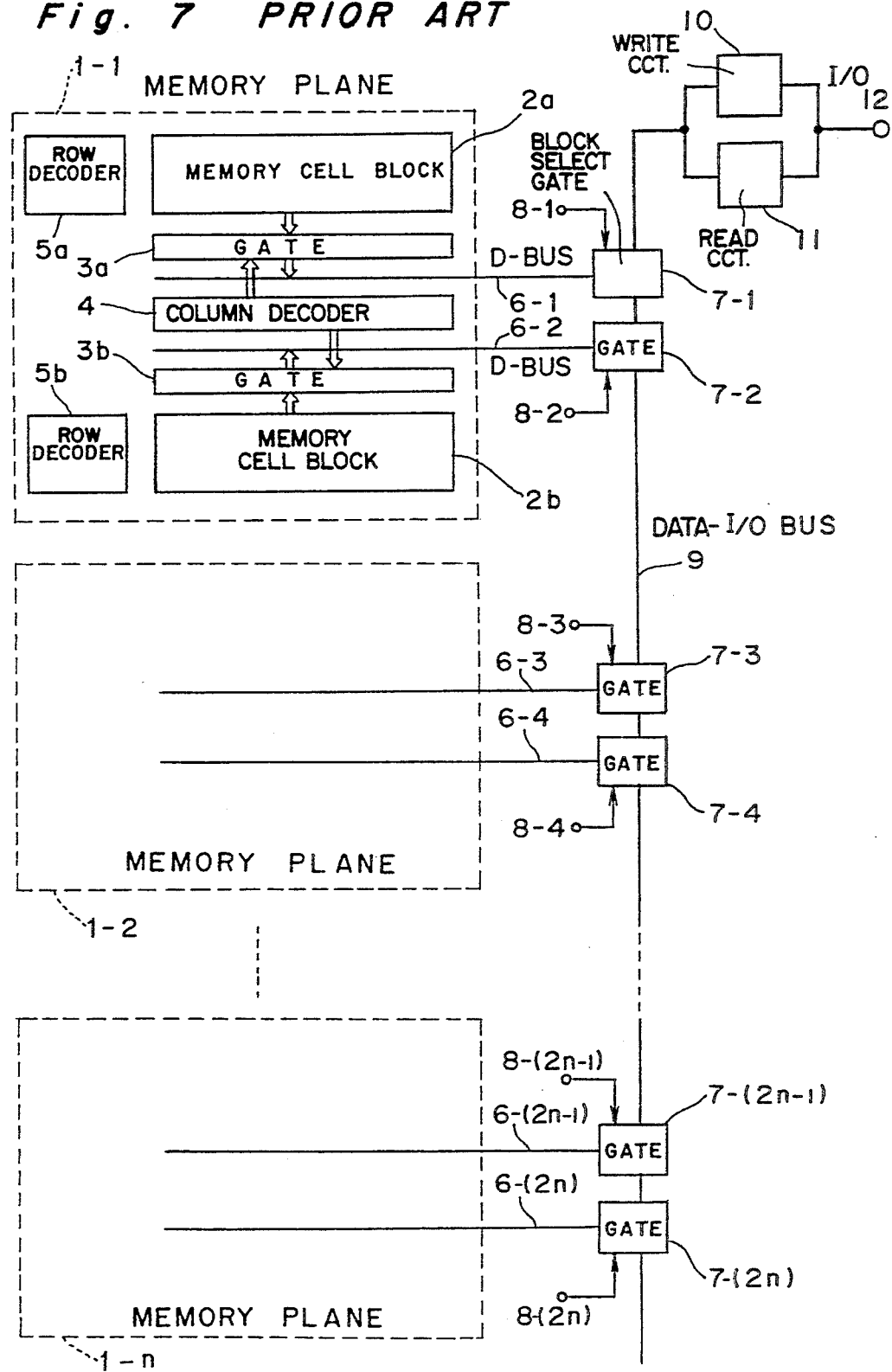
FIG. 7 is a schematic diagram of a prior art semiconductor memory device.
Figure 8:
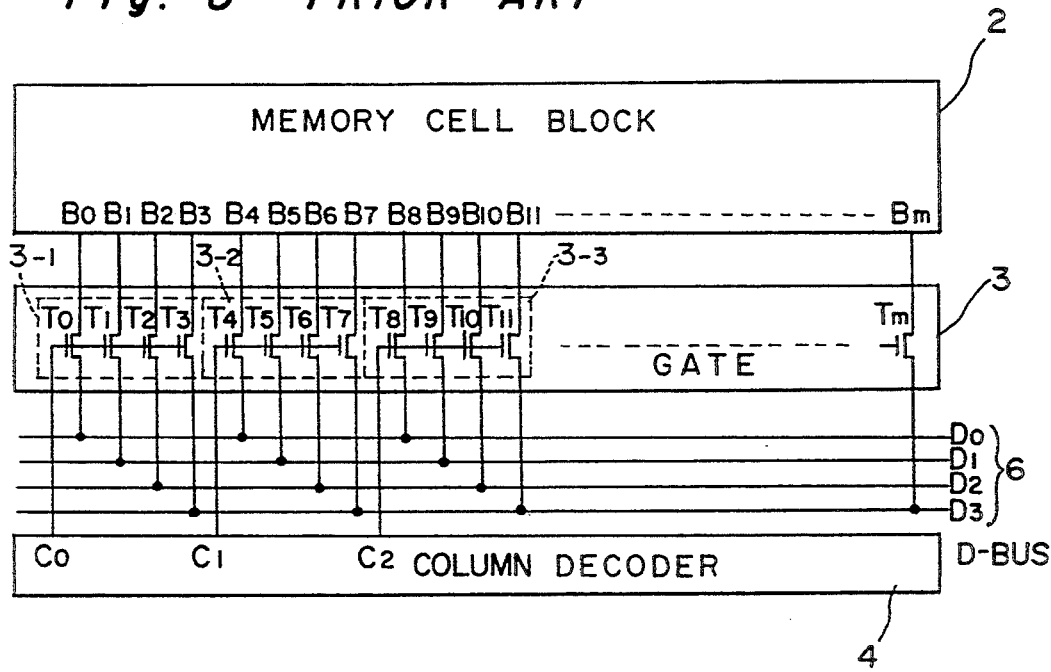
FIG. 8 is a circuit diagram of a column selector used in the semiconductor memory device of FIG. 7.
Figure 9:
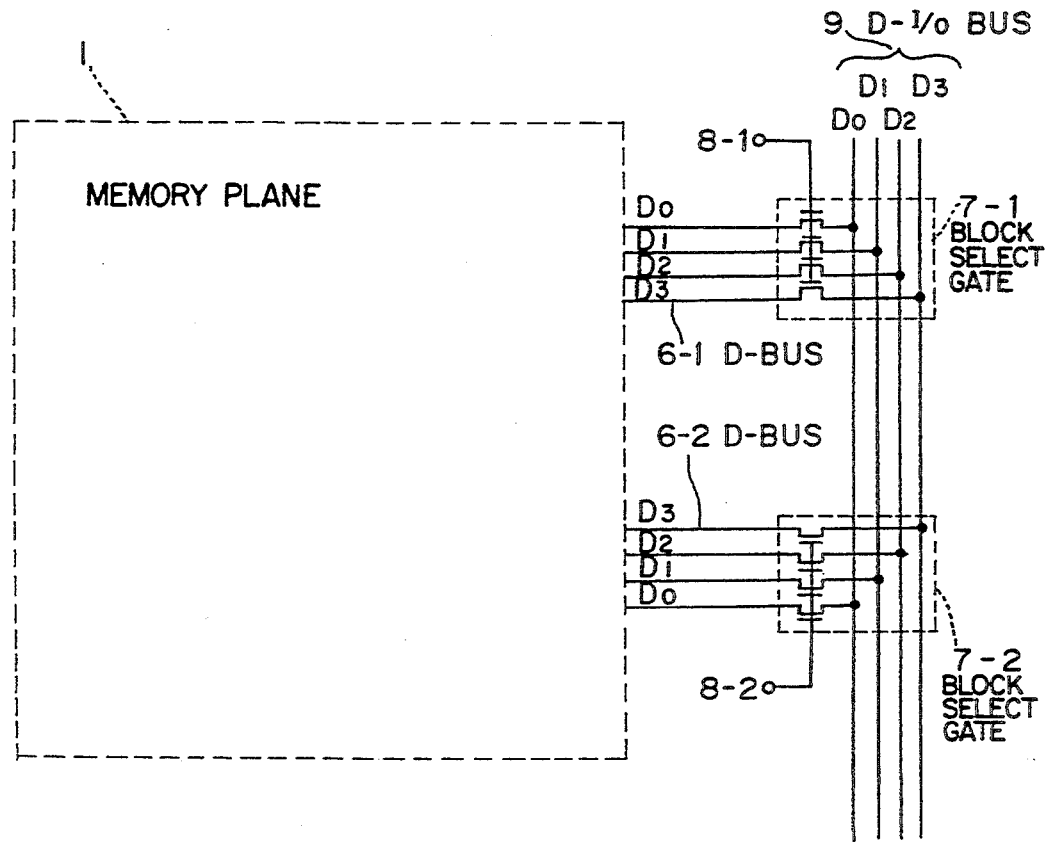
FIG. 9 is a circuit diagram of a block selection gate used in the semiconductor memory device of FIG. 7.
Figure 10:
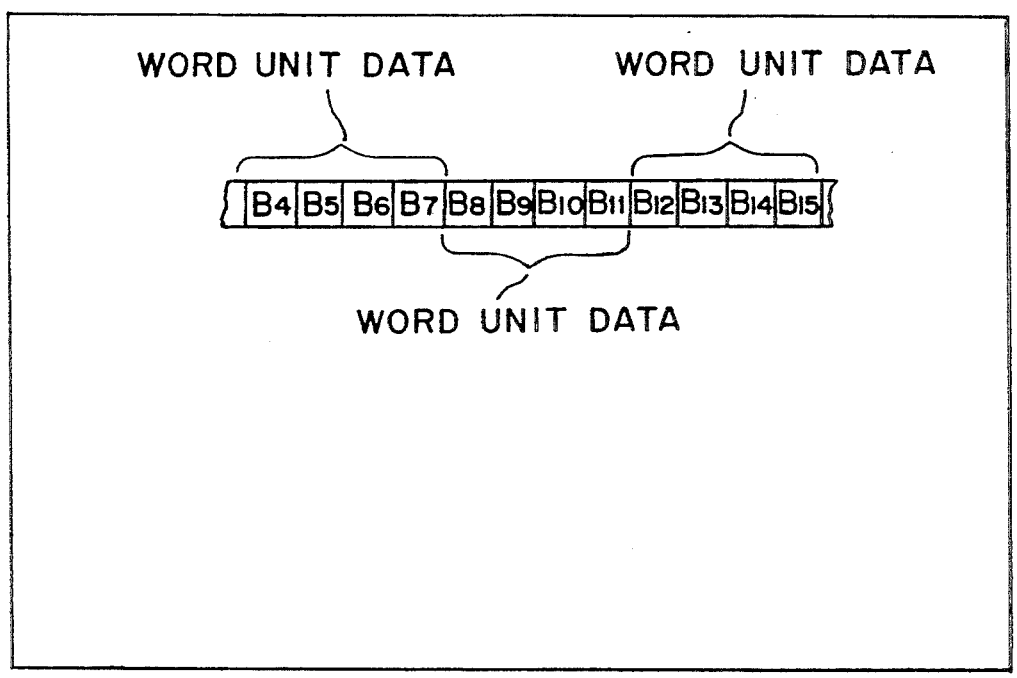
FIG. 10 is a diagrammatic view showing data access on an image display screen obtained by the semiconductor memory device of FIG. 7.

Referring to FIG. 1a, a schematic diagram of the column selector in a semiconductor memory device according to a first embodiment of the present invention is shown. In this embodiment the bit width of the data bus 6 is four bits D0, D1, D2 and D3, by way of example only. A memory cell block 2 comprises plural bit line outputs B0 ... Bm. A column selection gate 3 has plural switching transistors T0 ... Tm which are organized in selection gate groups 3-1, 3-2, 3-3, ... such that groups of four consecutive bit line outputs B0 ... Bm in the memory cell block 2 are consecutively connected to the data bus lines D0 ... D3, in the same manner as that described in connection with FIG. 7. Each of the selection switching transistors T0 ... Tm is driven independently by an output from a column selection gate controller 20. A column decoder 4 is used to access data in word units; its operation is the same as that of the column decoder described above in connection with FIGS. 7 and 8.

The column selection gate controller 20 is divided into sections 20-1, 20-2, and 20-3 to enable data access in word units. Each section includes AND gates and OR gates as shown in FIG. 1a, and has eight inputs applied thereto from bit position decoder 21 and column decoder 4, and four outputs for providing control signals to the four selection switching transistors in a selection gate group. More specifically, each of the three selection switching transistors for the lowest three bits in each section are driven by a circuit comprising two AND gates and one OR gate, and the selection switching transistor for the highest bit is driven by the output from the corresponding column decoder 4. The circuit comprising two AND gates and one OR gate described above forms the selection circuit which selects either the selection signal output $C_X$ or $C_{X-1}$ of column decoder 4, wherein $C_X$ is the output of column decoder 4 from which a HIGH level selection signal is being produced.

The bit position decoder 21 is provided for producing a signal indicating the starting bit position from which the four bit access should start within four selection switching transistors in each group. The bit position decoder 21 has two inputs 22 and 23 to which signals A00 and A01 are applied, and produces three control signals S0, S1 and S2, as shown in FIG. 1b. Furthermore, inverted control signals $\overline{S0}$, $\overline{S1}$ and $\overline{S2}$ are produced using an inverter inserted in a branched line from each of the three outputs. Three operation examples of the circuit shown in FIG. 1a are explained below.

Example 1

When it is required to access data from the first bit position in the second selection gate group 3-2, that is, when it is required to turn on switching transistors T4, T5, T6 and T7, the column decoder 4 produces a HIGH level signal from output C1 and a LOW level signal from the remaining outputs and, at the same time, signals (A01, A00) are made equal to (0,0). In this case, as shown in the table of FIG. 1b, three control signals (S0, S1, S2) are (0,0,0) and inverted control signals ($\overline{S0}$, $\overline{S1}$, $\overline{S2}$ are (1,1,1). Furthermore, output C0 is producing a LOW level signal, and output C1 is producing a HIGH level signal. Thus, in section 20-2, the three AND gates at the bottom row produce (1,1,1) and in turn, the three OR gates at the top row produce (1,1,1). Thus, switching transistors T4, T5 and T6 are all in an ON state. Furthermore, switching transistor T7 is turned ON by the HIGH level signal from output C1. Thus, consecutive transistors T4, T5, T6 and T7 are turned ON. Accordingly, in this case, as shown in the table of FIG. 2, lines D0, D1, D2 and D3 of the data bus carry data from consecutive outputs B4, B5, B6 and B7.

Example 2

When it is required to access data from the second bit position in the second selection gate group 3-2, that is, when it is required to turn on switching transistors T5, T6, T7 and T8, the column decoder 4 produces a HIGH level signal from output C1 and a LOW level signal from the remaining outputs and, at the same time, signals (A01, A00) are made (0,1). In this case, as shown in the table of FIG. 1b, three control signals (S0, S1, S2) are (1,0,0), and inverted control signals ($\overline{S0}$, $\overline{S1}$, $\overline{S2}$) are (0,1,1). Furthermore, output C0 is producing a LOW level signal, and output C1 is producing a HIGH level signal. Thus, in section 20-2, the three AND gates at the bottom row produce (0,1,1) from the left and the three AND gates in the middle row produce (0,0,0). Thus, the three OR gates at the top row produce (0,1,1) from left side thereof. Thus, switching transistors T4, T5 and T6 are respectively in OFF, ON and ON states. Furthermore, switching transistor T7 is turned ON by the HIGH level signal from output C1. Also, in section 20-3, the three AND gates at the bottom row produce (0,0,0), and the three AND gates in the middle row produce (1,0,0). Thus, transistor T8 is turned ON, and transistors T9 T10 and T11 are turned OFF. Thus, consecutive transistors T5, T6, T7 and T8 are turned ON. Accordingly, in this case, as shown in the table of FIG. 2, lines D0, D1, D2 and D3 of the data bus carry data from consecutive outputs B8, B5, B6 and B7. In this case, the data B5 . . . B8 on lines D0 . . . D3 are not aligned in the correct order. Therefore, the order of the lines D0 . . . D3 is rearranged in the later stage as will be described later in connection with FIG. 3.

Example 3

When it is required to access data from the third bit position in the second selection gate group 3-2, that is, when it is required to turn on switching transistors T6, T7, T8 and T9, the column decoder 4 produces a HIGH level signal from output C1 and a LOW level signal from the remaining outputs and, at the same time, signals (A01, A00) are made (1,0). In this case, as shown in the table of FIG. 1b, the three control signals (S0, S1, S2) produce (1,1,0), and the three inverted control signals ($\overline{S0}$, $\overline{S1}$, $\overline{S2}$) produce (0,0,1). Furthermore, output C0 is producing a LOW level signal, and output C1 is producing a HIGH level signal. Thus, in section 20-2, the three AND gates at the bottom row produce (0,0,1) from the left, and the three AND gates in the middle row produce (0,0,0). Thus, the three OR gates at the top row produce (0,0,1) from the left. Thus, switching transistors T4, T5 and T6 are respectively in OFF, OFF and ON states. Furthermore, switching transistor T7 is turned ON by the HIGH level signal from output C1. Also, in section 20-3, the three AND gates at the bottom row produce (0,0,0), and the three AND gates in the middle row produce (1,1,0). Thus, transistors T8 and T9 are turned ON and transistors T10 and T11 are turned OFF. Thus, consecutive transistor T6, T7, T8 and T9 are turned ON. Accordingly, in this case, as shown in the table of FIG. 2, lines D0, D1, D2 and D3 of the data bus carry data from consecutive outputs B8, B9, B6 and B7.

In the above described manner, the bit line outputs the memory cell block 2 connected to the bit lines D0 . . . D3 of the data bus 6 are organized, as shown in FIG. 2, according to the address input signals A00 and A01 for the bit position and the selection output signal of the column decoder 4. As shown in FIG. 1a, the memory cell block bit line outputs are selectively connected to each of the lines D0 . . . D3 of the data bus 6 as the word data for any desired position according to the position specification in bit units by means of the address input signals A00 and A01. However, the bit order of the data carried on lines D0 . . . D3 of the data bus 6 is not arranged according to the bit unit position specification. Next, the description is directed to the rearrangement of the bit lines D0 . . . D3.

Figure 3:
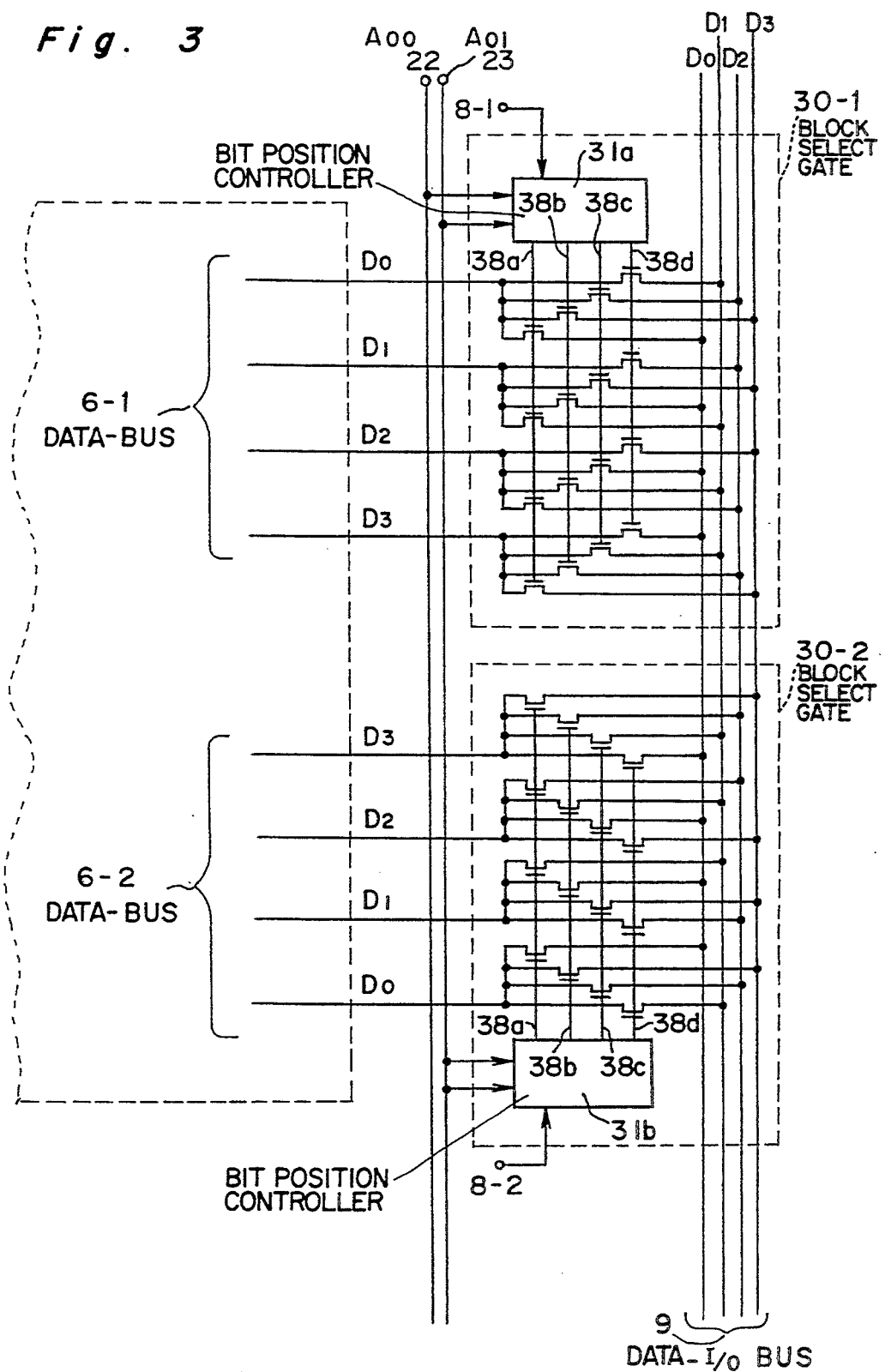
FIG. 3 is a circuit diagram showing a block selection gate in a semiconductor memory device according to a preferred embodiment of the present invention.

Referring to FIG. 3, a circuit diagram of the block selection gates 30 in a semiconductor memory device according to the preferred embodiment of the present invention is shown. This circuit rearranges or re-orders the data connected to the lines D0 . . . D3 in data bus 6 from the column selection gate 3.

The memory plane 1 shown in FIG. 3 includes two data buses 6-1 and 6-2 from two memory cell blocks 2. The block selection gates 30-1 and 30-2 selectively connect one of plural data buses 6-1 and 6-2 to the data I/O bus 9 according to the block selection signals 8-1 and 8-2.

Each of the block selection gates 30-1 and 30-2 comprises a number of switching transistor arrays equal to the bit width of the data word, providing one switching transistor array for one bit line D0, D1, D2 or D3 of the data buses 6-1 and 6-2. In one switching transistor array, there are four switching transistors which are connected to four lines D0 . . . D3 of the data I/O bus 9. Further provided in each block selection gate, e.g., gate 30-1, is a bit position controller 31a for controlling which of the block section gate switching transistors is driven by means of the block selection signals 8-1 and the address input signals A00 and A01 at terminals 22 and 23. The signals A00 and A01 are the same signals as those applied to the bit position decoder 21.

Figures 4A, 4B:
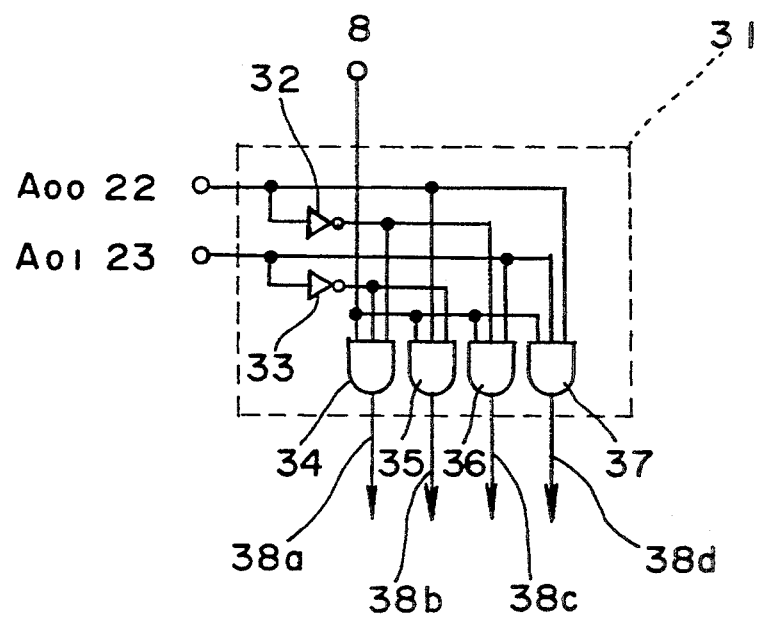

Referring to FIG. 4a, a detail of the bit position controller 31 is shown. The bit position control circuit 31 includes inverters 32 and 33 for receiving address signals A00 and A01, and AND gates 34, 35, 36 and 37 for producing outputs 38a, 38b, 38c and 38d, and is enabled by the block selection signal 8. The relationship between the address signals (A00, A01) and outputs (38a, 38b, 38c, 38d) is shown in FIG. 4b. Three operation examples of the circuit shown in FIG. 3 are explained below in relation to the three examples of the circuit of FIG. 1a described above.

Example 1

In this example, lines D0, D1, D2 and D3 of the data bus 6-1 carry data from consecutive outputs B4, B5, B6 and B7, and signals (A01, A00) are made equal to (0,0).

Figures 5, 6:
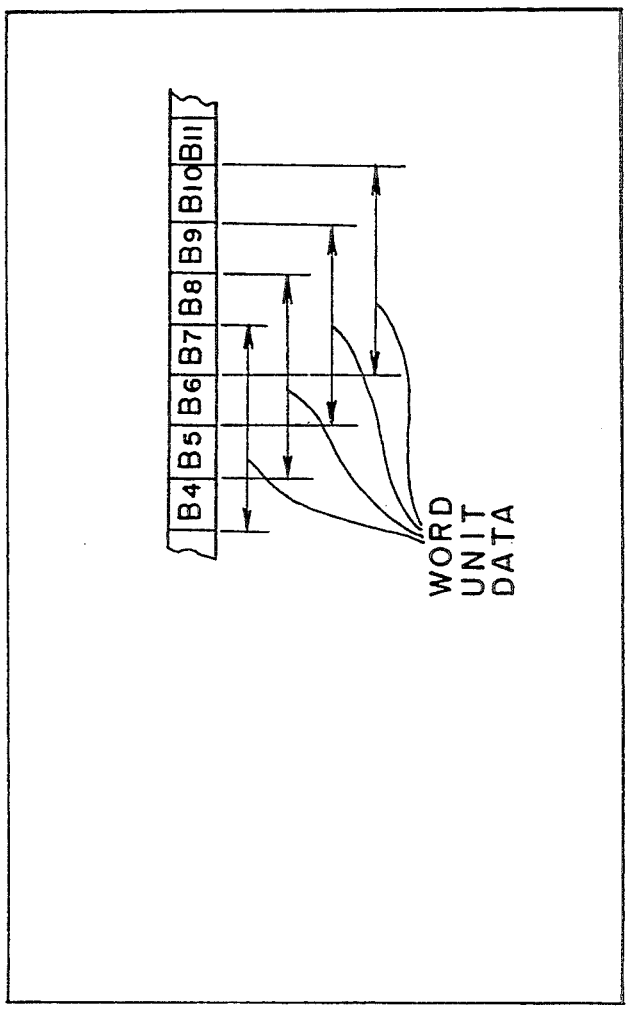
FIG. 5 is a table describing the bit order on the data I/O bus shown in FIG. 3.
FIG. 6 is a diagrammatic view showing data access on an image display screen obtained by the semiconductor memory device of the present invention.

Furthermore, a HIGH level signal is applied to terminal 8-1. Thus, outputs (38a, 38b, 38c, 38d) produce (1,0,0,0), as shown in the table of FIG. 4b. In this case, the first switching transistor from the left in each switching transistor array shown in FIG. 3 is turned on. Thus, lines D0, D1, D2 and D3 of the data bus 6-1, carrying data from outputs B4, B5, B6 and B7, are connected respectively to lines D0, D1, D2 and D3 of the data I/O bus 9. Thus, lines D0, D1, D2 and D3 of bus 9 carry data from outputs B4, B5, B6 and B7 in the order as stated, as shown in FIG. 5.

Example 2

In this example, lines D0, D1, D2 and D3 of the data bus 6-1 carry data from consecutive outputs B8, B5, B6 and B7, and signals (A01, A00) are made equal (0,1). Furthermore, a HIGH level signal is applied to terminal 8-1. Thus, outputs (38a, 38b, 38c, 38d) produce (0,1,0,0), as shown in the table of FIG. 4b. In this case, the second switching transistor from the left in each switching transistor array shown in FIG. 3 is turned on. Thus, lines D0, D1, D2 and D3 of the data bus 6-1, carrying data from outputs B8, B5, B6 and B7, are connected respectively to lines D3, D0, D1 and D2 of the data I/O bus 9. Thus, lines D0, D1, D2 and D3 of bus 9 carry data from outputs B5, B6, B7 and B8 in the correct order, as shown in FIG. 5.

Example 3

In this example, lines D0, D1, D2 and D3 of the data bus 6-1j carry data from consecutive outputs B8, B9, B6 and B7, and signals (A01, A00) are made equal to (1,0). Furthermore, a HIGH level signal is applied to terminal 8-1. Thus, outputs (38a, 38b, 38c, 38d) produce (0,0,1,0), as shown in the table of FIG. 4b. In this case, the third switching transistor from the left in each switching transistor array shown in FIG. 3 is turned on. Thus, lines D0, D1, D2 and D3 of the data bus 6-1, carrying data from outputs B8, B9, B6 and B7, are connected respectively to lines D2, D3, D0 and D1 of the data I/O bus 9. Thus, lines D0, D1, D2 and D3 of bus 9 carry data from outputs B6, B7, B8 and B9 in the correct order, as shown in FIG. 5.

In the above described manner, the data order of the bit lines in the memory cell block 2 as shown in the data bus 6 in FIG. 2 is rearranged in natural number increasing order on the data I/O bus 9 as shown in FIG. 5 regardless of the bit unit position specification. FIG. 6 illustrates data access of the display screen area when the semiconductor memory of the invention is used as a video memory storing image data for display as graphic data on a display screen. Using the semiconductor memory device of the present invention, word data can be accessed from any starting position in one-bit units as shown in FIG. 6.

Because a semiconductor memory device according to the present invention as described hereinabove can access data in one word units using a simple construction by specifying the position in one-bit units, access in pixel units is possible when the semiconductor memory is used as a video memory for storing display images. As a result, operations on pixel units required for image processing do not require the external provision of a barrel shifter for bit shifting or a mask processing circuit to mask the bits on which a read/write operation is not performed. An image processing system with a simple construction can thus be achieved, and an image processing system with a high processing speed can be achieved because barrel shifting and mask processing is not required.

Although the present invention has been fully described in connection with the preferred embodiments thereof with reference to the accompanying drawings, it is to be noted that various changes and modifications will be apparent to those skilled in the art. Such changes and modifications are to be understood as being included within the scope of the present invention as defined by the appended claims unless they depart therefrom.

What is claimed is:

1. A semiconductor memory device for accessing data of a predetermined number of bits comprising:
    a single memory cell block means for storing a plurality of words, each word having the predetermined number of bits, said memory cell block means having a plurality of memory cell outputs;
    a column gate means connected to said memory cell outputs;
    a gate control means for controlling said column gate means to access and output a predetermined number of consecutive bits of said memory cell outputs, said predetermined number of consecutive bits, including a portion of one word and a portion of a subsequent word, being aligned such that said portion of said subsequent word is followed by said portion of said one word; and
    a data re-ordering means for re-ordering said predetermined number of consecutive bits to align them such that said portion of said one word is followed by said portion of said subsequent word;
    wherein said gate control means includes a single column decoder and a bit position decoder each providing signal outputs which, when logically combined, produce signals for controlling said column gate means, said bit position decoder producing a signal indicating a starting bit position in said one word from which the accessing of the predetermined number of bits is to start.

2. A semiconductor memory device as claimed in claim 1, further comprising:
    a first bus structure connected between said column gate means and said data re-ordering means for sending therebetween said predetermined number of consecutive bits aligned such that said portion of said subsequent word is followed by said portion of said one word; and
    a second bus structure connected to said data re-ordering means for receiving said predetermined number of consecutive bits aligned such that said portion of said one word is followed by said portion of said subsequent word.

3. A semiconductor memory device as claimed in claim 1, wherein said gate control means comprises a selecting means for selecting said predetermined number of bits starting from said starting bit position.

4. A semiconductor memory device as claimed in claim 1, wherein said data re-ordering means comprises a plurality of switching element arrays, each array receiving one bit of data and disposing said one bit of data at a desired bit position of said designated complete word.

5. A semiconductor memory device as claimed in claim 4, wherein said data re-ordering means further comprises a bit position control means for selecting one element in each switching element array in accordance with said starting bit position.

* * * * *